United States Patent
Dong

(10) Patent No.: US 11,653,458 B2
(45) Date of Patent: May 16, 2023

(54) FLEXIBLE DISPLAY DEVICE

(71) Applicant: BOE Technology Group Co., Ltd., Beijing (CN)

(72) Inventor: Liming Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/518,260

(22) Filed: Nov. 3, 2021

(65) Prior Publication Data

US 2022/0240399 A1    Jul. 28, 2022

(30) Foreign Application Priority Data

Jan. 25, 2021  (CN) .......................... 202110095518.8

(51) Int. Cl.
  *H05K 5/02*        (2006.01)
  *G06F 1/16*        (2006.01)

(52) U.S. Cl.
  CPC .......... *H05K 5/0217* (2013.01); *G06F 1/1652* (2013.01)

(58) Field of Classification Search
  CPC ... G06F 1/1652; G06F 1/1624; H05K 5/0017; H05K 5/0217; H04M 1/0268; G09F 9/301
  See application file for complete search history.

(56) References Cited

U.S. PATENT DOCUMENTS

| | | | |
|---|---|---|---|
| 9,195,272 B2 * | 11/2015 | O'Brien | G06F 1/1652 |
| 10,194,543 B2 * | 1/2019 | Seo | G06F 1/1626 |
| 2016/0155965 A1 | 6/2016 | Kusuura | |
| 2019/0182947 A1 | 6/2019 | Xiang et al. | |
| 2022/0386485 A1 | 12/2022 | Dong et al. | |

FOREIGN PATENT DOCUMENTS

| | | |
|---|---|---|
| CN | 107067981 A | 8/2017 |
| CN | 111862822 A | 10/2020 |
| CN | 111862825 A | 10/2020 |
| CN | 111933031 A | 11/2020 |
| CN | 112150930 A | 12/2020 |
| CN | 114446181 A | 5/2022 |

OTHER PUBLICATIONS

CN 202110095518.8 first office action.

* cited by examiner

*Primary Examiner* — James Wu
(74) *Attorney, Agent, or Firm* — IPro, PLLC

(57) ABSTRACT

A flexible display device is provided, including: a housing including a support surface, one end of the support surface being bent to form an curved region; a flexible display screen at least partially covering the support surface; and a flexible support layer arranged between the flexible display screen and the support surface for supporting the flexible display screen, one end of the flexible support layer covering the support surface and being connected to the support surface via a first adhesive layer, where the flexible support layer is further connected to the curved region via a snap-fit structure.

16 Claims, 4 Drawing Sheets

FLEXIBLE DISPLAY DEVICE

CROSS-REFERENCE TO RELATED APPLICATIONS

This application claims priority to Chinese Patent Application No. 202110095518.8 filed in China on Jan. 25, 2021, which is incorporated by reference herein in its entirety.

TECHNICAL FIELD

The present disclosure relates to the field of display technology, and in particular to a flexible display device.

BACKGROUND

Due to such advantages as small size, portability, bending and folding, a flexible display panel has become a mainstream display panel. A rollable display is another innovative application field of the flexible display panel, which enables consumers to freely change a display area of the flexible display panel according to their own needs.

SUMMARY

According to one aspect of the present disclosure, a flexible display device is provided, including: a housing including a support surface, one end of the support surface being bent to form an curved region; a flexible display screen at least partially covering the support surface; a flexible support layer arranged between the flexible display screen and the support surface for supporting the flexible display screen, one end of the flexible support layer covering the support surface and being connected to the support surface via a first adhesive layer, where the flexible support layer is further connected to the support surface via a snap-fit structure located in the curved region; an elastic element connected to the housing and the other end of the flexible support layer for applying a pulling force to the flexible support layer to make a display region of the flexible display screen expand or contract as a roller moves; and the roller disposed on a side of the flexible support layer away from the flexible display screen, the flexible display screen and the flexible support layer being wound on the roller.

Optionally, a plurality of snap-fit structures are located in non-display regions on both sides of the flexible display screen in a width direction, and the width direction of the flexible display screen is parallel to an extension direction of the roller.

Optionally, each snap-fit structure includes a through-hole penetrating the flexible support layer and a fixing column arranged on the support surface, and the snap-fit structure is formed by snap-fit of the fixing column and the hole.

Optionally, the fixing column includes a first portion extending from the support surface and a second portion perpendicular to the first portion, and the second portion abuts against a surface of the flexible support layer away from the support surface after passing through the through-hole.

Optionally, the flexible display device further includes a second adhesive layer arranged on a side of the flexible support layer away from the support surface and covering the second portion, and the flexible support layer is connected to the flexible display screen via the second adhesive layer.

Optionally, the fixing column is of a T-shaped or inverted L-shaped structure.

Optionally, the second portion of the fixing column is made of an elastic material.

Optionally, the first portion and the second portion of the fixing column are each made of an elastic material.

Optionally, the fixing column is formed integrally with the support surface, or connected to the support surface by welding or adhered to the support surface.

Optionally, a cross-section of the through-hole is of a trapezoidal shape.

Optionally, a cross-sectional area of the through-hole at a side close to the curved region is larger than a cross-sectional area of the through-hole at a side close to the flexible display screen.

Optionally, a plurality of through-holes are formed in the flexible support layer and spaced apart from each other at a same spacing.

Optionally, the flexible support layer includes a curved portion in the curved region and a non-curved portion, and a thickness of the curved portion is smaller than a thickness of the non-curved portion.

Optionally, a groove is formed in the flexible support layer in the curved region and extends in a width direction of the flexible display screen, and the width direction of the flexible display screen is parallel to an extension direction of the roller.

Optionally, the groove is located in a surface of the flexible support layer close to the flexible display screen.

Optionally, a plurality of grooves are provided and spaced apart from each other at a same spacing in the flexible support layer in the curved region.

BRIEF DESCRIPTION OF THE DRAWINGS

The embodiments of the present disclosure will be described in further detail below in conjunction with the accompanying drawings.

DETAILED DESCRIPTION

Figure 1:
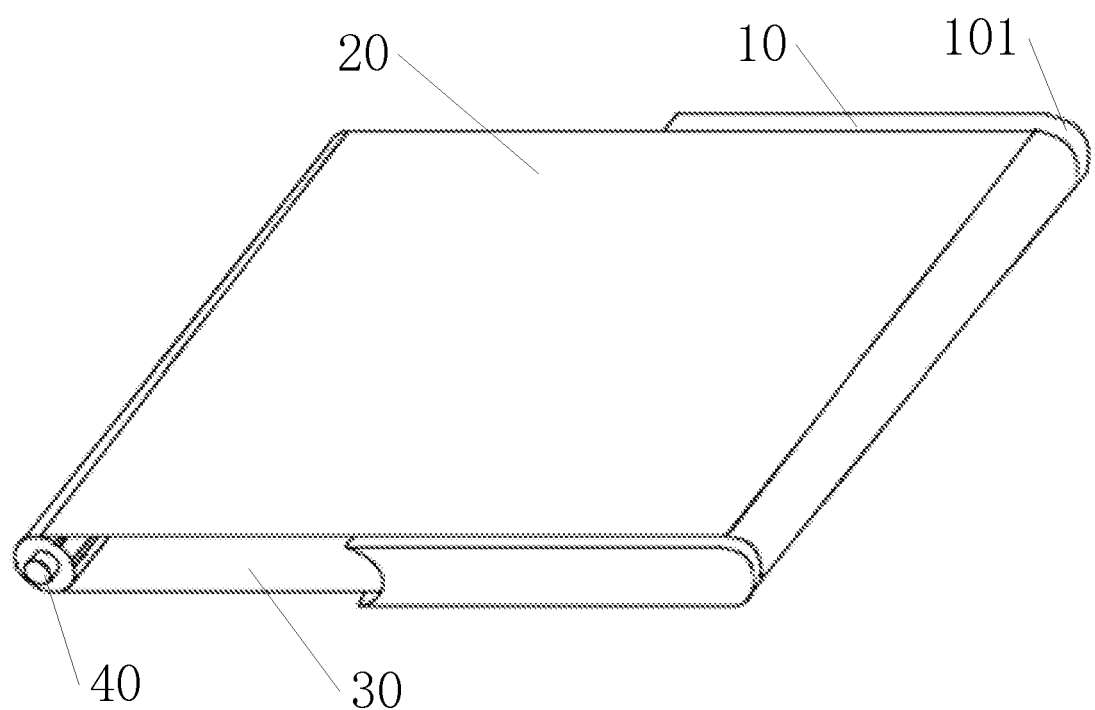
FIG. 1 shows a schematic diagram illustrating the structure of a flexible display device according to the present disclosure.

In order to illustrate the present disclosure in a clearer manner, a further description of the present disclosure is provided below in connection with optional embodiments and accompanying drawings. Similar parts in the drawings are denoted by the same reference numerals. It should be appreciated by persons of ordinary skill in the art that the following detailed description is intended to be illustrative and not restrictive, and that it is not intended to limit the scope of the present disclosure.

As the flexible display has the advantage of being bendable and foldable, the display device having a rollable mechanism becomes an innovative application field of the flexible display screen, which enables users to adjust the display area of the flexible display screen at will according to their own needs. As a result, it is not only convenient for users to carry with them, but also provides users with better experience. Thus, it is an important direction of flexible display screen development. The display device having the rollable mechanism generally includes a housing, a flexible display screen, a flexible metal support layer and a roller, the flexible metal support layer is connected to the flexible display screen, and when the roller rotates, the flexible display screen and the flexible metal support layer are driven to expand or contract.

One end of the flexible display screen is connected to the housing, and the other end thereof is connected to an elastic element after winding the roller. In order to increase a screen-to-body ratio and achieve a full-screen display effect, a curved region with a large curvature is formed at the one end of the flexible display screen connected to the housing. The flexible support layer is arranged on a back side of the flexible display screen (a side away from a display surface of the flexible display screen), and the flexible support layer functions as to support the flexible display screen, so as to avoid that the back side of the flexible display screen is not well supported when the flexible display screen is unfolded, resulting in that the flexible display screen is easily damaged when a user uses the flexible display screen, thus resulting in such a problem as display defect of the flexible display screen. However, when the flexible support layer is connected to the curved region of the edge of the housing, an adhesive connection is usually used at present, due to such factors as a relatively large elastic modulus of the flexible support layer, a relatively large fitting curvature and tangential dislocation of the adhesive layer in a rolling process, the flexible support layer and the housing are easily separated from each other, which greatly reduces the production yield of the flexible display device and increases the production cost.

Based on this, a flexible display device is provided in some embodiments of the present disclosure, so as to avoid the problem of detachment of the flexible support layer from the housing.

Figure 2:
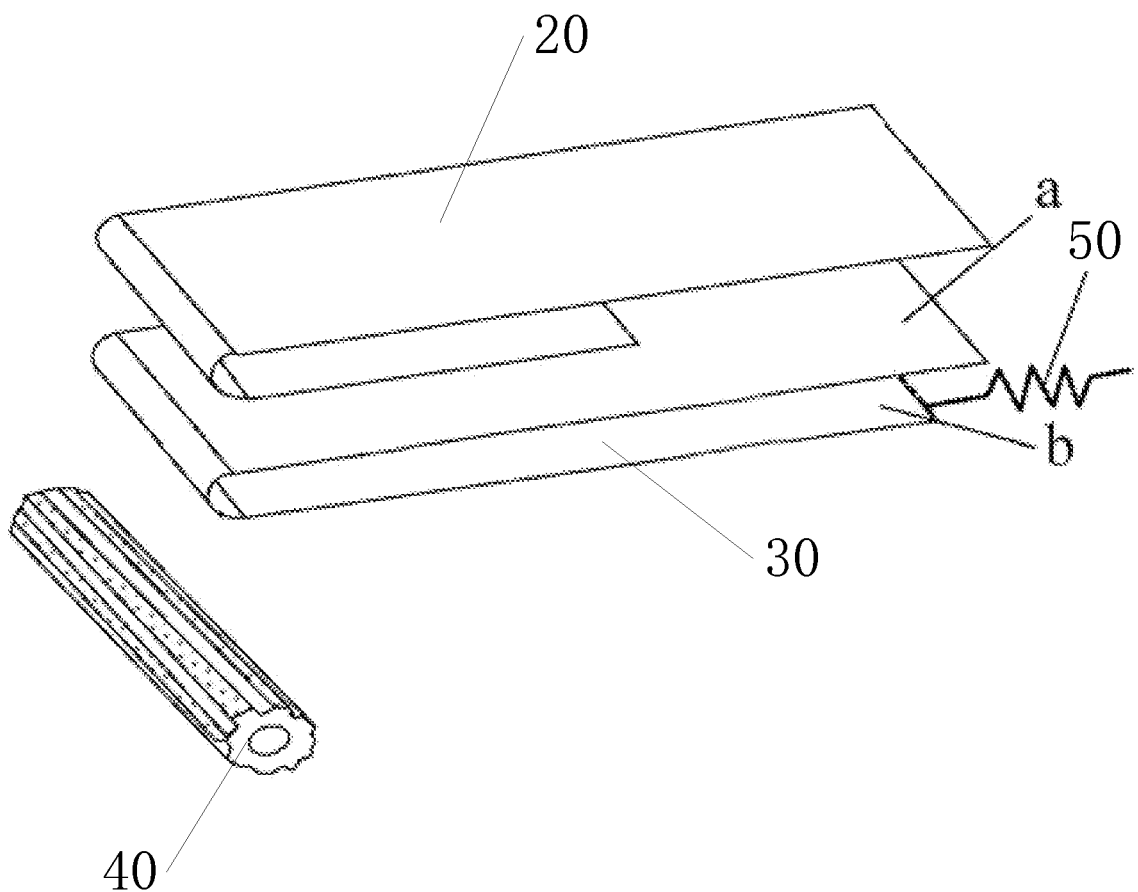
FIG. 2 shows a partially exploded view of the flexible display device according to the present disclosure.

As shown in FIGS. 1 and 2, the flexible display device includes a housing 10, a flexible display screen 20, a flexible support layer 30, a roller 40 and an elastic element 50.

The housing 10 includes a support surface, one end of the support surface away from the roller 40 is bent to form a curved region 101. At least partial region of the flexible display screen 20 covers the curved region 101, so as to form a curved screen. The flexible support layer 30 is arranged between the flexible display screen 20 and the support surface, and is connected to the flexible display screen 20 for supporting the flexible display screen 20. A first end a of the flexible support layer 30 covers the curved region 101 and is connected to the support surface. The flexible support layer 30 is adhered to the support surface of the housing 10 via a first adhesive layer. It should be appreciated that the flexible support layer 30 is adhered to the curved region 101 via the first adhesive layer, and a snap-fit structure is further provided on the flexible support layer 30 and the curved region 101. That is, the flexible support layer 30 is connected to the curved region 101 via the first adhesive layer as well as the snap-fit structure, so it is able to prevent the flexible support layer 30 from separating from the curved region 101 after the first adhesive layer fails, thereby greatly improving the production yield of the flexible display device.

The elastic element 50 is located in the housing 10 and connected to the housing 10 and a second end b of the flexible support layer 30, and is capable of being elastically deformed under an external force. The roller 40 is arranged on a side of the flexible support layer 30 away from the flexible display screen 20, and the flexible display screen 20 and the flexible support layer 30 are wound on the roller 40. That is, the flexible support layer 30 is in contact with the roller 40 and wound on the roller 40, and on this basis, the flexible display screen 20 is connected to the flexible support layer 30, as a result, the flexible display screen 20 is also wound on the roller 40 via the flexible support layer 30.

Figure 3:
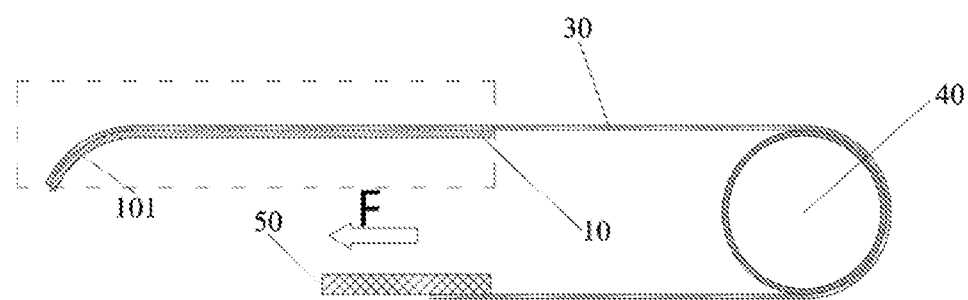
FIG. 3 shows a cross-sectional view of a partial structure of the flexible display device according to the present disclosure.

As shown in FIG. 3, the support surface is a part of the housing 10, the side edge of the support surface away from the roller 40 is formed as the curved region 101, and the flexible support layer 30 is connected to the support surface at the first end a, i.e., the flexible support layer 30 is connected to the housing 10 at the first end a. The flexible support layer 30 is connected to the curved region 101 at the first end a, such that the display region of the flexible display 20 increases when the roller 40 is moved away from the housing 10 and decreases when the roller 40 is moved towards the housing 10. The elastic element 50 applies a pulling force F to the flexible support layer 30, so that the display region of the flexible display screen 20 increases or decreases as the scroll 40 moves.

The two sides of the flexible support layer 30 are respectively connected to the curved surface region 101 and the flexible display screen 20 via adhesive layers, the adhesive layers are each formed by curing an adhesive glue, and the adhesive glue may be Optically Clear Adhesive (OCA), Optical Clear Resin (OCR) or other suitable materials, and the embodiments of the present disclosure are not limited thereto.

Figure 4:
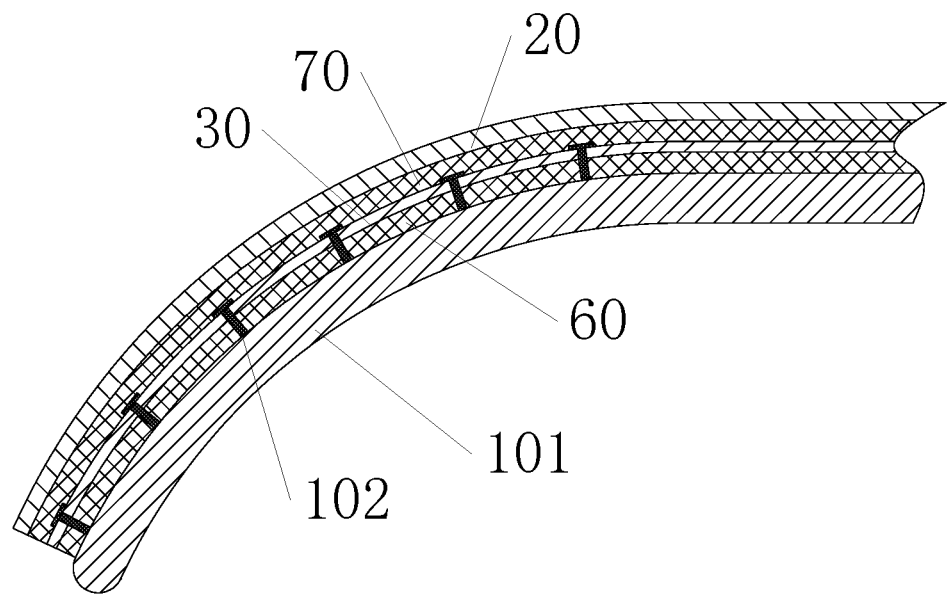
FIG. 4 shows a cross-sectional view of a curved region of the flexible display device according to the present disclosure.

As shown in the partial cross-sectional view of the curved region 101 in FIG. 4, an upper surface of the curved region 101 of the housing 10 is connected to the flexible support layer 30 via the first adhesive layer 60, and an upper surface of the flexible support layer 30 is connected to the flexible display screen 20 via a second adhesive layer 70. The curved region 101 of the display device of the present disclosure is further connected to the flexible support layer 30 via a plurality of snap-fit structures. Optionally, the snap-fit structures are located in non-display regions on both sides of the flexible display screen 20 in a width direction, namely, the snap-fit structures are provided in the non-display regions on upper and lower sides of the flexible display screen 20, so as to prevent the snap-fit structures from affecting the display region. The width direction of the flexible display screen is parallel to an extension direction of the roller.

Figure 5:
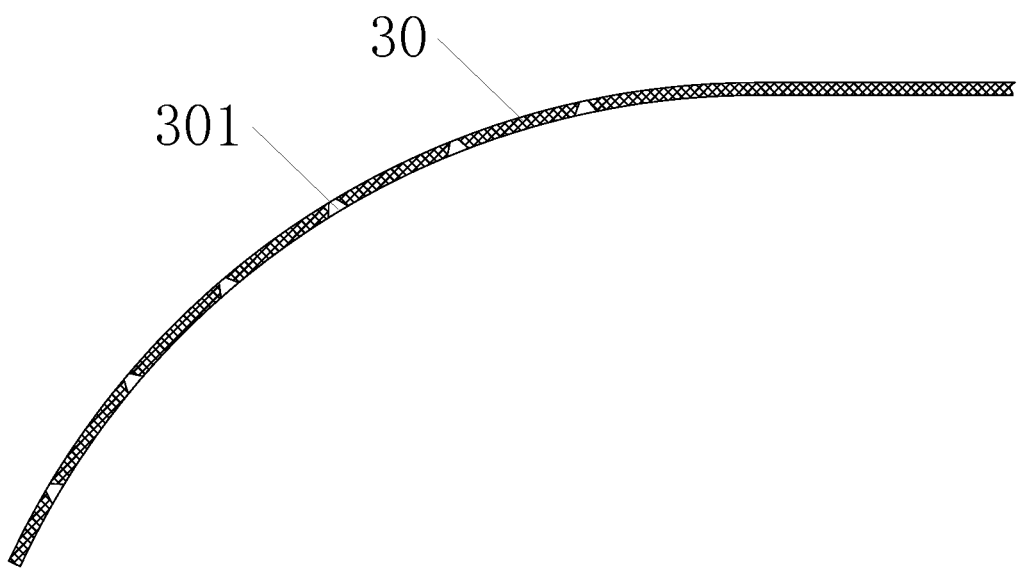
FIG. 5 shows a cross-sectional view of a flexible support layer of the flexible display device according to the present disclosure.

Referring to FIGS. 4 and 5, the snap-fit structures include a plurality of fixing columns 102 arranged in the curved region 101 of the support surface, and through-holes 301 penetrating the flexible support layer, the snap-fit structures are formed by the snap-fitting of the fixing columns 102 and the through-holes 301.

In some embodiments, the fixing column 102 includes a first portion extending from the support surface and a second portion perpendicular to the first portion, and the second portion abuts against a surface of the flexible support layer 30 away from the support surface after passing through the through-hole 301.

Specifically, the second portion of the fixing column 102 abuts against the upper surface of the flexible support layer 30 after passing through the through-hole 301, so as to connect the housing 10 in the curved region 101 to the flexible support layer 30, thereby to avoid the problem that the flexible support layer 30 is detached from the housing 10 in the curved region 101 due to the failure of the first adhesive layer 60.

In some embodiments, the flexible display device further includes the second adhesive layer arranged on a side of the flexible support layer away from the support surface and covering the second portion, and the flexible support layer is connected to the flexible display screen via the second adhesive layer.

The second adhesive layer may eliminate a level difference introduced by the second portion.

In the embodiments of the present disclosure, the fixing column 102 is of a T-shaped or inverted L-shaped structure, and an upper end portion (namely, the second portion) and a lower portion (namely, the first portion) of the T-shaped or inverted L-shaped structure may be made of the same or different materials. For example, the upper end portion is made of a soft material, and the lower portion is made of a hard material. In the present embodiment, the upper end portion of the T-shaped structure is made of an elastic material, such as a silicone material. Since the silicone material is a soft material with a certain elasticity, the upper end portion of the T-shaped or inverted L-shaped structure passes through the through-hole 301. In some embodiments, both the first portion and the second portion of the fixing column are each made of a resilient material.

Further, a cross-section of the through-hole 301 is of a trapezoidal shape, i.e., the through-hole 301 is a tapered through-hole. In some embodiments, a cross-sectional area of the through-hole is at a side close to the curved region is larger than a cross-sectional area of the through-hole at a side close to the flexible display screen.

As shown in FIG. 5, as the opening of the through-hole 301 is larger close to the curved region 101 and smaller close to the flexible display screen 20, so as to facilitate the upper end portion of the T-shaped structure passing through the through-hole 301.

In the embodiment of the present disclosure, since a plurality of fixing columns 102 are provided and spaced apart from each other at a same spacing, a plurality of through-holes 301 corresponding to the fixing columns 102 are also provided and spaced apart from each other at the same spacing, so as to improve the connection strength of the curved region 101 of the housing 10 and the flexible support layer 30.

In some embodiments, the fixing columns 102 may be integrally formed with the curved region 101 of the housing 10 or may be connected to the curved region 101 by welding or adhered to the curved region 101.

In some embodiments, the flexible support layer 30 includes a curved portion in the curved region 101 and a non-curved portion, and a thickness of the curved portion is smaller than a thickness of the non-curved portion.

Through the overall thinning of the flexible support layer 30 in the curved portion, it is able to reduce the rigidity of the curved portion of the flexible support layer 30, further mitigate the warping and rebound problem of the flexible support layer 30, and improve the yield of the display device.

A level difference between the curved portion and the non-curved portion of the flexible support layer 30 may be compensated by the first adhesive layer 60, so as not to affect the display effect.

Figure 6:
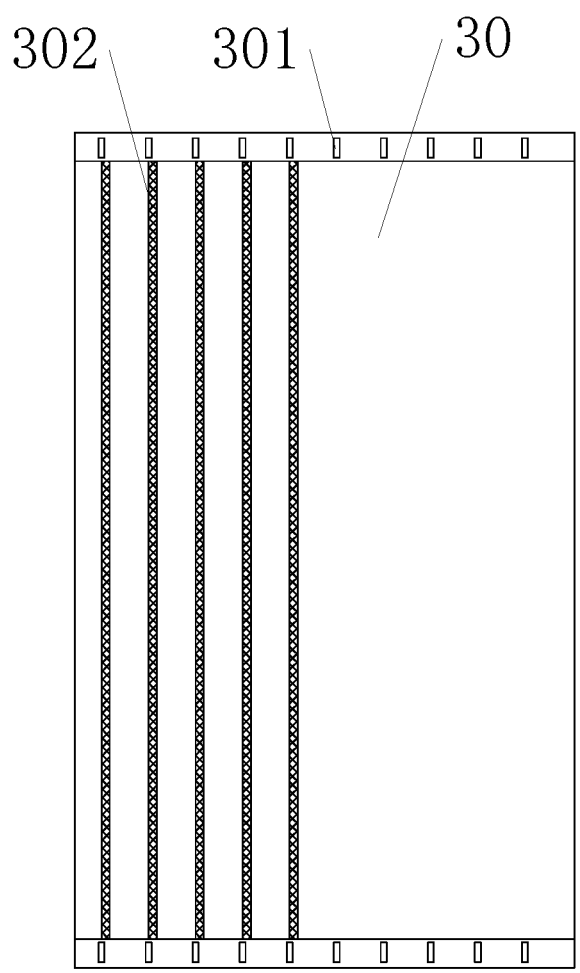
FIG. 6 shows a top view of the flexible support layer according to the present disclosure.

In some embodiments, as shown in FIG. 6, a groove 302 is formed in the flexible support layer 30 in the curved region 101, alternatively, a plurality of grooves 302 are provided and spaced apart from each other at a same spacing. In some embodiments, the grooves 302 are located in a surface of the flexible support layer 30 close to the flexible display screen.

By partially thinning the flexible support layer 30 in the curved region 101, it is able to reduce the rigidity of the flexible support layer 30 at the curved region 101, further mitigate the problem of warping and rebound of the flexible support layer 30, and improve the yield of the display device.

It should be appreciated that, each groove 302 extends in the width of flexible display screen 20 and may across the display region of flexible display screen 20. The specific position of the groove 302 is not limited, as long as it is located in the curved region 101, the number of grooves 302 is also not limited, and a person skilled in the art may select a corresponding one according to actual needs.

It will be obvious that the above-mentioned embodiments of the present disclosure are merely examples for clearly illustrating the present disclosure, rather than limiting the embodiments of the present disclosure, and that various other changes and modifications may be made by those skilled in the art based on the above description, thus it is not intended to be exhaustive or to limit the invention to the embodiments disclosed, and all such obvious changes and modifications fall within the scope of the present disclosure.

What is claimed is:

1. A flexible display device, comprising:
   a housing comprising a support surface, one end of the support surface being bent to form a curved region;
   a flexible display screen at least partially covering the support surface;
   a flexible support layer arranged between the flexible display screen and the support surface for supporting the flexible display screen, a first end of the flexible support layer covering the support surface and being connected to the support surface via a first adhesive layer, wherein the flexible support layer is further connected to the support surface via one or more snap-fit structures located in the curved region;
   an elastic element connected to the housing and a second end of the flexible support layer for applying a pulling force to the flexible support layer to make a display region of the flexible display screen expand or contract as a roller moves; and
   the roller disposed on a side of the flexible support layer away from the flexible display screen, the flexible display screen and the flexible support layer being wound on the roller.

2. The flexible display device according to claim 1, wherein the snap-fit structures are located in non-display regions on both sides of the flexible display screen in a width direction, and the width direction of the flexible display screen is parallel to an extension direction of the roller.

3. The flexible display device according to claim 2, wherein each snap-fit structure comprises a through-hole penetrating the flexible support layer and a fixing column arranged on the support surface, and the snap-fit structure is formed by snap-fit of the fixing column and the through-hole.

4. The flexible display device according to claim 3, wherein the fixing column comprises a first portion extending from the support surface and a second portion perpendicular to the first portion, and the second portion abuts against a surface of the flexible support layer away from the support surface after passing through the through-hole.

5. The flexible display device according to claim 4, further comprising a second adhesive layer arranged on a side of the flexible support layer away from the support surface and covering the second portion, and the flexible support layer is connected to the flexible display screen via the second adhesive layer.

6. The flexible display device according to claim 3, wherein the fixing column is of a T-shaped or inverted L-shaped structure.

7. The flexible display device according to claim 3, wherein the second portion of the fixing column is made of an elastic material.

8. The flexible display device according to claim 3, wherein the first portion and the second portion of the fixing column are each made of an elastic material.

9. The flexible display device according to claim 3, wherein the fixing column is formed integrally with the support surface, or connected to the support surface by welding or adhered to the support surface.

10. The flexible display device according to claim 3, wherein a cross-section of the through-hole is of a trapezoidal shape.

11. The flexible display device according to claim 10, wherein a cross-sectional area of the through-hole at a side close to the curved region is larger than a cross-sectional area of the through-hole at a side close to the flexible display screen.

12. The flexible display device according to claim 3, wherein through-holes of the snap-fit structures are formed in the flexible support layer and spaced apart from each other at a same spacing.

13. The flexible display device according to claim 1, wherein the flexible support layer comprises a curved portion in the curved region and a non-curved portion, and a thickness of the curved portion is smaller than a thickness of the non-curved portion.

14. The flexible display device according to claim 1, wherein a groove is formed in the flexible support layer in the curved region and extends in a width direction of the flexible display screen, and the width direction of the flexible display screen is parallel to an extension direction of the roller.

15. The flexible display device according to claim 14, wherein the groove is located in a surface of the flexible support layer close to the flexible display screen.

16. The flexible display device according to claim 14, wherein a plurality of grooves are provided and spaced apart from each other at a same spacing in the flexible support layer in the curved region.

* * * * *